United States Patent
Yu et al.

(10) Patent No.: US 8,050,035 B2
(45) Date of Patent: Nov. 1, 2011

(54) HEAT DISSIPATION DEVICE

(75) Inventors: Ye-Fei Yu, Shenzhen (CN); Shu-Yuan Xu, Shenzhen (CN); Xin-Xiang Zha, Shenzhen (CN); Lin Yang, Shenzhen (CN); Jun Ding, Shenzhen (CN); Jer-Haur Kuo, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 128 days.

(21) Appl. No.: 12/409,499

(22) Filed: Mar. 24, 2009

(65) Prior Publication Data

US 2009/0310306 A1 Dec. 17, 2009

(30) Foreign Application Priority Data

Jun. 13, 2008 (CN) .......................... 2008 1 0067740

(51) Int. Cl.
*H05K 7/20* (2006.01)

(52) U.S. Cl. ........ 361/697; 361/695; 361/709; 361/710; 165/80.2; 165/80.3; 165/104.33

(58) Field of Classification Search .................. 361/695, 361/697, 709, 710; 165/80.2, 80.3, 104.33, 165/185

See application file for complete search history.

(56) References Cited

U.S. PATENT DOCUMENTS

| | | | | | |
|---|---|---|---|---|---|
| 5,386,338 | A | * | 1/1995 | Jordan et al. | 361/704 |
| 5,464,054 | A | * | 11/1995 | Hinshaw et al. | 165/80.3 |
| 5,677,829 | A | * | 10/1997 | Clemens | 361/697 |
| 5,761,041 | A | * | 6/1998 | Hassanzadeh et al. | 361/704 |
| 5,943,209 | A | * | 8/1999 | Liu | 361/695 |
| 6,175,499 | B1 | * | 1/2001 | Adams et al. | 361/704 |
| 6,332,251 | B1 | * | 12/2001 | Ho et al. | 24/459 |
| 6,894,898 | B2 | * | 5/2005 | Liu | 361/697 |
| 7,123,483 | B2 | * | 10/2006 | Otsuki et al. | 361/710 |
| 7,142,429 | B2 | * | 11/2006 | Hsieh et al. | 361/710 |
| 7,269,010 | B2 | * | 9/2007 | Yu et al. | 361/697 |
| 7,518,874 | B2 | * | 4/2009 | Deng et al. | 361/710 |
| 7,539,017 | B2 | * | 5/2009 | Chang | 361/703 |
| 7,697,297 | B2 | * | 4/2010 | Chen et al. | 361/719 |
| 2002/0162647 | A1 | * | 11/2002 | Wagner | 165/121 |
| 2003/0019609 | A1 | * | 1/2003 | Hegde | 165/80.3 |
| 2003/0048608 | A1 | * | 3/2003 | Crocker et al. | 361/697 |
| 2005/0141193 | A1 | * | 6/2005 | Otsuki et al. | 361/695 |
| 2006/0092610 | A1 | * | 5/2006 | Hegde | 361/697 |
| 2007/0119567 | A1 | * | 5/2007 | Yeh et al. | 165/80.3 |
| 2008/0024994 | A1 | * | 1/2008 | Cheng | 361/710 |
| 2009/0154099 | A1 | * | 6/2009 | Li et al. | 361/697 |
| 2010/0073878 | A1 | * | 3/2010 | Zha et al. | 361/697 |

* cited by examiner

*Primary Examiner* — Anatoly Vortman

(74) *Attorney, Agent, or Firm* — Altis Law Group, Inc.

(57) ABSTRACT

A heat dissipation device includes a heat sink and a cooling fan arranged thereon. The cooling fan includes a motor-stator and an impeller mounted around the motor-stator. The motor-stator is arranged on a middle of the heat sink. The heat sink includes a base and a plurality of fins extending upwardly from the base. The heat sink defines a plurality of notches incising the fins. The notches are angled towards the middle of the heat sink immediately under the motor-stator of the cooling fan.

17 Claims, 3 Drawing Sheets

HEAT DISSIPATION DEVICE

BACKGROUND

1. Technical Field

The disclosure relates to heat dissipation, and particularly to a heat dissipation device with improved fin structure.

2. Description of Related Art

It is well known that heat is generated by electronic components such as integrated circuit chips during operation thereof. If the heat is not efficiently removed, the electronic components may suffer damage. Thus, heat dissipation devices are often used to cool the electronic components.

A typical heat dissipation device includes a heat sink and a cooling fan arranged on the heat sink. Electronic components are usually attached to a center of the heat sink, the location at which heat generated by the electronic component is primarily concentrated. The cooling fan includes a motor at a center thereof, and an impeller mounted around the motor. During operation of the cooling fan, the motor drives the impeller to rotate and generate airflow towards the heat sink. However, due to blocked access to the motor, only a small portion of the airflow reaches the middle of the heat sink immediately under the motor, such that heat concentrated at the middle of the heat sink cannot be efficiently dissipated.

What is needed, therefore, is a heat dissipation device which can overcome the described limitations.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
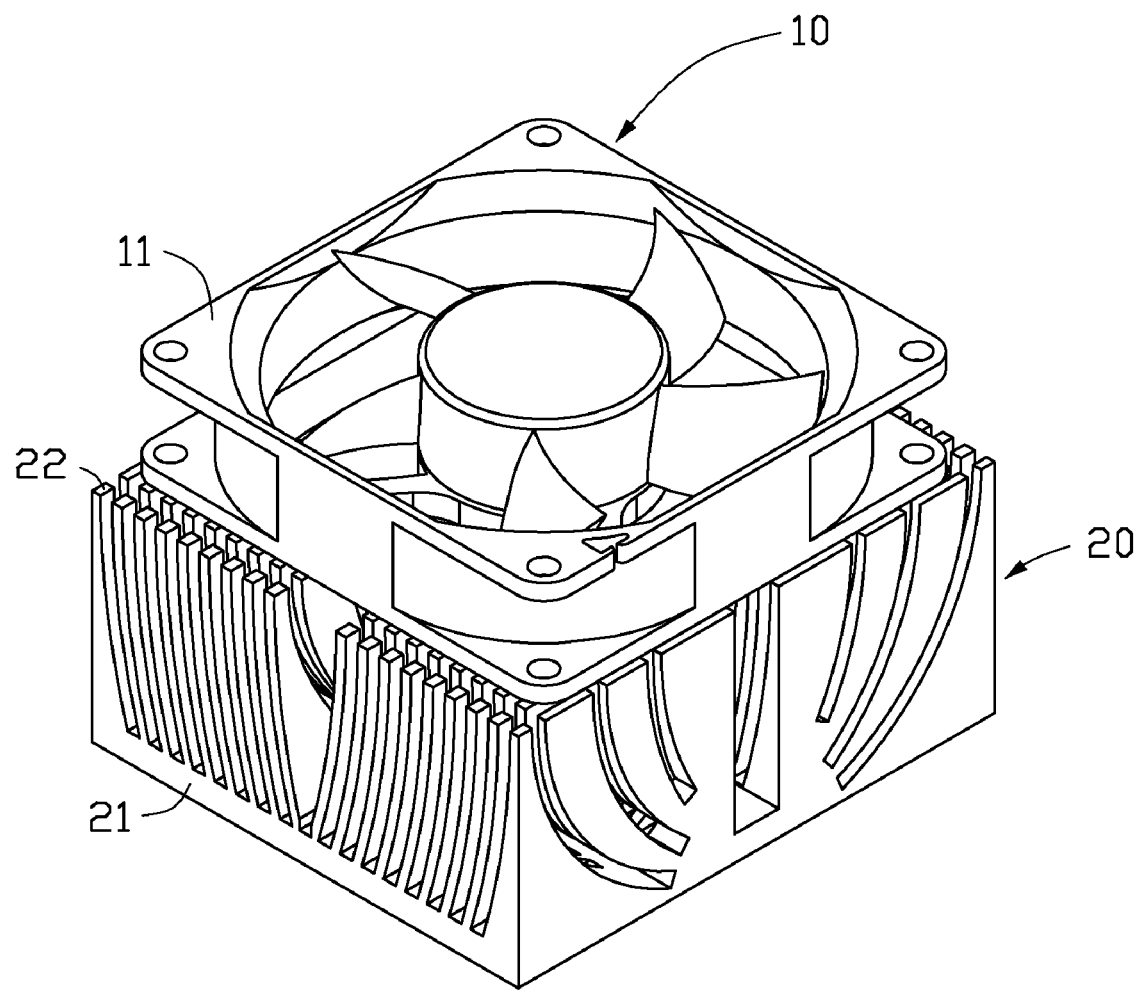
FIG. 1 is an assembled, isometric view of a heat dissipation device in accordance with a first embodiment of the disclosure.
Figure 2:
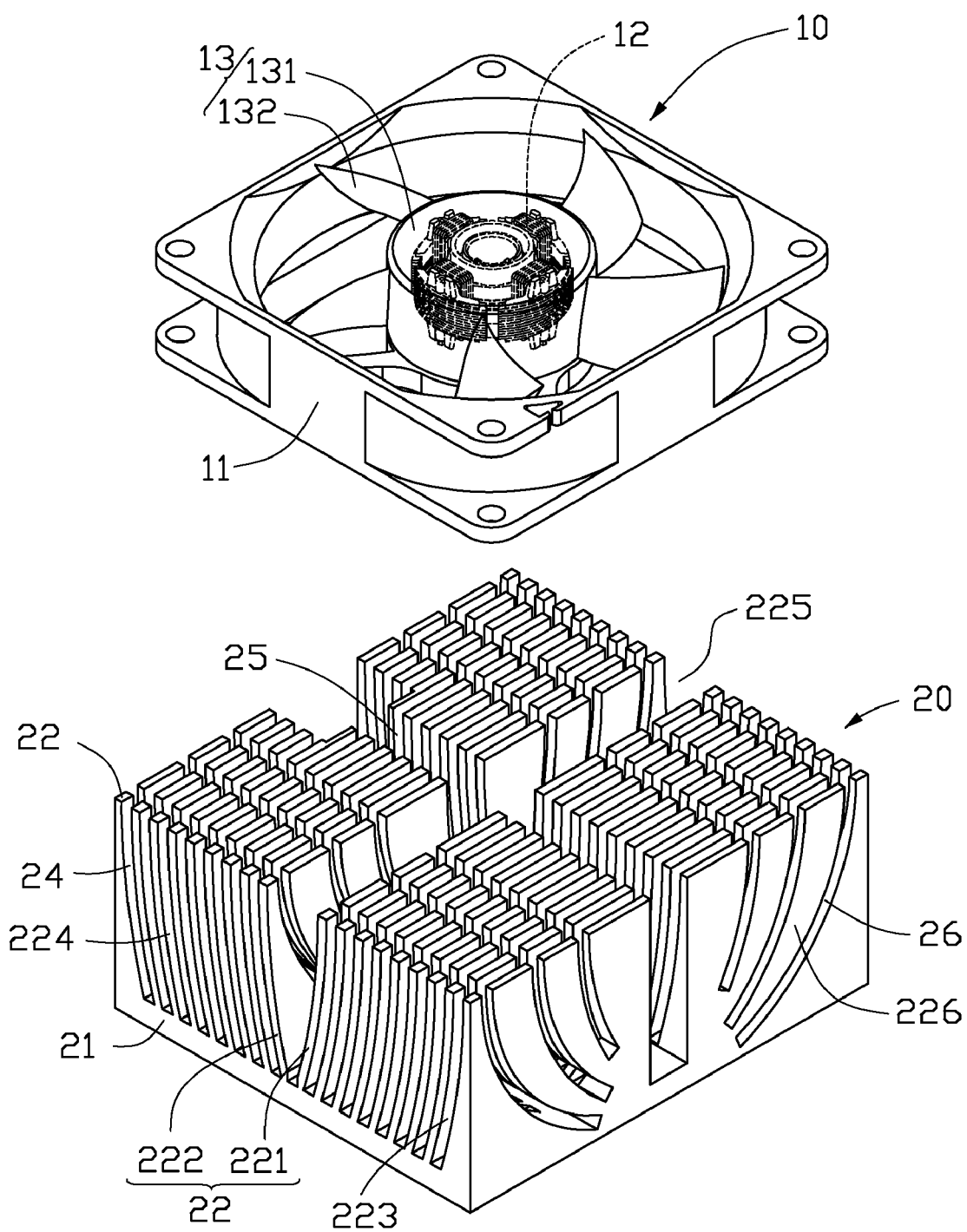
FIG. 2 is an exploded, isometric view of the heat dissipation device of FIG. 1.

Referring to FIGS. 1 and 2, a heat dissipation device in accordance with a first embodiment includes a heat sink 20 and a cooling fan 10 arranged on the heat sink 20.

The cooling fan 10 is an axial fan, and includes a frame 11, a motor-stator 12 mounted in the frame 11, and an impeller 13 mounted around the motor-stator 12. The motor-stator 12 is arranged at the middle of the heat sink 20. The impeller 13 includes a hub 131 covering the motor-stator 12, and a plurality of blades 132 extending radially and outwardly from an outer periphery of the hub 131.

The heat sink 20 includes a base 21 and a plurality of fins 22 extending upwardly from a top surface of the base 21. The base 21 is rectangular, with a bottom surface thereof thermally contacting with an electronic component (not shown). Each of the fins 22 is arcuate and extends laterally. The fins 22 are divided into two groups: a front group 221 at a front side of the heat sink 20 and a rear group 222 at a rear side of the heat sink 20. The fins 22 of the front group 221 are parallel, with each fin 22 of the front group 221, extending upward and forward. The fins 22 of the rear group 222 are parallel, with each fin 22 of the rear group 222, extending upward and rearward. A front air channel 223 is defined between every two adjacent fins 22 of the front group 221 laterally, a rear air channel 224 is defined between every two adjacent fins 22 of the front group 222 laterally, and a middle air channel 225 is defined between the front group 211 and the rear group 212 laterally. The middle air channel 225 is located at the middle of the heat sink 20 laterally, and increases in width gradually moving upwardly from the base 21 of the heat sink 20. The front air channels 223 between the fins 22 of the front group 221 and the rear air channels 224 between the fins 22 of the rear group 222 are symmetrically distributed on two sides (front and rear sides) of the middle air channel 225. The front air channels 223 are arcuate from the front side towards the middle air channel 225 of the heat sink 20, and the rear air channels 224 are arcuate from the rear side towards the middle air channel 225 of the heat sink 20.

The heat sink 20 defines a rectangular groove 25 at the middle thereof transversely, so as to receive a clip (not shown) therein for mounting the heat sink 20 on the electronic component. The groove 25 communicates the front side with the rear side of the heat sink 20, and is perpendicular to and communicates with the front air channels 223, the rear air channels 224, and the middle air channel 225. The heat sink 20 further defines a plurality of notches 26 incising the fins 22. The notches 26 are symmetrically distributed on two sides (left and right sides) of the groove 25. The notches 26 are perpendicular to and communicate with the front air channels 223, the rear air channels 224, and the middle air channel 225. Each of the notches 26 is angled towards the groove 25. In this embodiment, there are three notches 26 located at each side of the groove 25, and the notches 26 are arcuate. Depth in a longitudinal direction of the notches 26 at each side of the groove 25 increases gradually away from the groove 25. A gradient of the notches 26 at each side of the groove 25 also increases gradually away from the groove 25. Each of the fins 22 is divided into a plurality of fin parts 224 by the notches 26. The fin parts 224 are joined together at a bottom end thereof, and separated from each other at a top end thereof.

During operation of the heat dissipation device, the motor-stator 12 of the cooling fan 10 drives the impeller 11 to rotate, generating airflow towards the heat sink 20. The airflow surrounding the motor-stator 12 is guided towards the middle of the heat sink 20 immediately under the motor-stator 12 through the front air channels 223, the rear air channels 224, the middle air channel 225, and the notches 26. Thus, the airflow towards the middle of the heat sink 20 is increased, whereby heat primarily concentrated at the middle of the heat sink 20 is efficiently removed.

Figure 3:
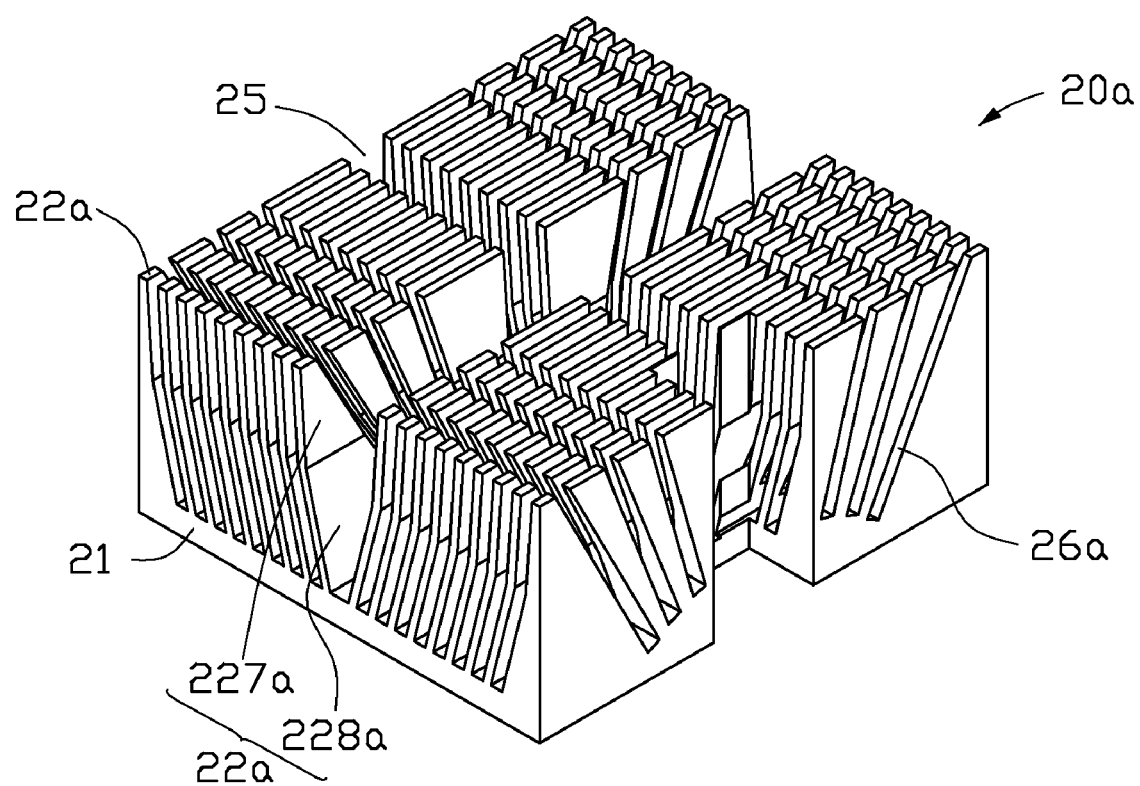
FIG. 3 is an isometric view of a heat sink of a heat dissipation device in accordance with a second embodiment of the disclosure.

Referring to FIG. 3, a heat sink 20a of a heat dissipation device in accordance with a second embodiment of the disclosure is shown. The heat sink 20a of the second embodiment differs from the heat sink 20 of the first embodiment only in that the fins 22a of the heat sink 20a are V-shaped. Each of the fins 22a includes an upper portion 227a and a lower portion 228a. The upper portion 227a and the lower portion 228a of each fin 22a are planar. The lower portion 228a angles upwardly from the base 21, and the upper portion 227a extends upwardly and perpendicularly from a top end of the lower portion 228a. An obtuse angle is defined between the upper portion 227a and the lower portion 228a. The notches 26a angle directly towards the middle of the heat sink 20a.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device comprising:
   a cooling fan comprising a motor-stator and an impeller mounted around the motor-stator; and
   a heat sink on which the cooling fan is mounted, the heat sink comprising a plurality of fins and defining at least one notch incising the fins, the at least one notch being angled towards a portion of the heat sink immediately under the motor-stator of the cooling fan;
   wherein the fins are divided into a first group at a front side of the heat sink and a second group at a rear side of the heat sink, the fins of the first group angling from the front side towards the portion of the heat sink immediately under the motor-stator, and the fins of the second group angling from the rear side towards the portion of the heat sink immediately under the motor-stator.

2. The heat dissipation device of claim 1, wherein the motor-stator of the cooling fan is arranged on a middle of the heat sink, and the at least one notch is angled towards the middle of the heat sink.

3. The heat dissipation device of claim 2, wherein the at least one notch is arcuate or straight.

4. The heat dissipation device of claim 2, wherein the heat sink defines a plurality of notches incising the fins, and the notches are angled towards the middle of the heat sink.

5. The heat dissipation device of claim 4, wherein the heat sink further defines a groove at the middle thereof along a direction from the rear side towards the front side opposite to the rear side, the notches being symmetrically distributed at two sides of the groove, the groove being adapted for receiving a clip for securing the heat sink to an electronic component.

6. The heat dissipation device of claim 5, wherein a depth in a longitudinal direction of the notches at each side of the groove increases gradually away from the groove.

7. The heat dissipation device of claim 5, wherein a gradient of the notches at each side of the groove increases gradually away from the groove.

8. The heat dissipation device of claim 2, wherein an air channel is defined between every two adjacent fins along a direction from a right side towards a left side opposite to the right side of the heat sink, and the at least one notch is perpendicular to and communicates with the air channels between the fins.

9. The heat dissipation device of claim 8, wherein the air channel between every two adjacent fins of the first group is arcuate from the front side towards the middle of the heat sink, and the air channel between every two adjacent fins of the second group is arcuate from the rear side towards the middle of the heat sink.

10. The heat dissipation device of claim 8, wherein each of the fins includes an upper portion and a lower portion, both planar, and wherein an obtuse angle is defined between the upper portion and the lower portion, and at least one of the upper and lower portions is angled towards the middle of the heat sink.

11. The heat dissipation device of claim 8, wherein the air channel between the first group and the second group is located at the middle of the heat sink along the direction from the right side towards the left side, and increases in width gradually moving upwardly from the heat sink.

12. The heat dissipation device of claim 1, wherein the heat sink comprises a base configured for thermally connecting with an electronic component at a bottom surface thereof, and the fins extend upwardly from a top surface of the base.

13. A heat sink comprising:
    a base; and
    a plurality of fins extending upwardly from the base, a plurality of notches incising the fins and angling from a lateral side of the heat sink towards a middle of the heat sink;
    wherein the fins are divided into a front group at a front side of the heat sink and a rear group at a rear side of the heat sink, the fins of the front group angling from the front side towards the middle of the heat sink, and the fins of the rear group angling from the rear side towards the middle of the heat sink; and
    wherein a depth in a longitudinal direction of a notch near the middle of the heat sink is less than that of a notch away from the middle of the heat sink.

14. The heat sink of claim 13, wherein a gradient of a notch near the middle of the heat sink is less than that of a notch away from the middle of the heat sink.

15. The heat sink of claim 13, wherein an air channel is defined between every two adjacent fins, and the notches are perpendicular to and communicate with the air channels between the fins.

16. The heat sink of claim 15, wherein the air channel between the front group and the rear group is located at the middle of the heat sink laterally, and has a width increasing gradually and upwardly from the base of the heat sink, the air channels between the fins of the front group angle from the front side towards the middle air channel of the heat sink, and the air channels between the fins of the rear group angle from the rear side towards the middle air channel of the heat sink.

17. A heat sink comprising:
    a base; and
    a plurality of fins extending upwardly from the base, a plurality of notches incising the fins and angling from a lateral side of the heat sink towards a middle of the heat sink;
    wherein the fins are divided into a front group at a front side of the heat sink and a rear group at a rear side of the heat sink, the fins of the front group angling from the front side towards the middle of the heat sink, and the fins of the rear group angling from the rear side towards the middle of the heat sink; and
    wherein a gradient of a notch near the middle of the heat sink is less than that of a notch away from the middle of the heat sink.

* * * * *